(12) United States Patent
Denis

(10) Patent No.: US 10,181,551 B2
(45) Date of Patent: Jan. 15, 2019

(54) LED USING LUMINESCENT SAPPHIRE AS DOWN-CONVERTER

(71) Applicant: Lumileds LLC, San Jose, CA (US)

(72) Inventor: Gregoire Francois Florent Denis, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/150,020

(22) Filed: May 9, 2016

(65) Prior Publication Data

US 2016/0254420 A1    Sep. 1, 2016

Related U.S. Application Data

(62) Division of application No. 14/761,115, filed as application No. PCT/IB2014/058016 on Jan. 2, 2014, now abandoned.

(Continued)

(51) Int. Cl.
*H01L 33/50* (2010.01)
*H01L 33/02* (2010.01)
(Continued)

(52) U.S. Cl.
CPC ........ *H01L 33/504* (2013.01); *H01L 33/0075* (2013.01); *H01L 33/0095* (2013.01);
(Continued)

(58) Field of Classification Search
CPC ... H01L 33/0095; H01L 33/50; H01L 33/501; H01L 33/502; H01L 33/507; H01L 33/508
See application file for complete search history.

(56) References Cited

U.S. PATENT DOCUMENTS 6,811,607 B2   11/2004  Akselrod
7,633,217 B2   12/2009  Sakata et al.
(Continued)

FOREIGN PATENT DOCUMENTS

CN   101090143 A   12/2007
CN   101834253 A   9/2010
(Continued)

OTHER PUBLICATIONS

EPO as ISA, International Search Report and Written Opinion from International Application No. PCT/IB2014/058016 filed Jan. 2, 1014, 12 pages.
(Continued)

*Primary Examiner* — Cuong Q Nguyen
(74) *Attorney, Agent, or Firm* — Volpe and Koenig, P.C.

(57) ABSTRACT

An LED die includes a luminescent sapphire layer affixed to LED semiconductor layers. The luminescent sapphire absorbs a portion of the primary light and down-converts the primary light to emit secondary light. A phosphor layer may be added. The luminescent sapphire may comprise luminescent sapphire particles in a binder forming a mixture deposited over the LED semiconductor layers. Alternatively, the luminescent sapphire comprises a pre-formed tile that is affixed over the LED semiconductor layers. Alternatively, the luminescent sapphire comprises a luminescent sapphire growth substrate on which is epitaxially grown the LED semiconductor layers. After the LED die is formed, the luminescent characteristics of the sapphire may be adjusted using optical conditioning and/or annealing to tune the die's overall emission.

14 Claims, 5 Drawing Sheets

Related U.S. Application Data

(60) Provisional application No. 61/831,244, filed on Jun. 5, 2013, provisional application No. 61/753,175, filed on Jan. 16, 2013.

(51) Int. Cl.
  *H01L 33/32* (2010.01)
  *H01L 33/54* (2010.01)
  *H01L 33/00* (2010.01)

(52) U.S. Cl.
  CPC ............ *H01L 33/025* (2013.01); *H01L 33/32* (2013.01); *H01L 33/502* (2013.01); *H01L 33/505* (2013.01); *H01L 33/507* (2013.01); *H01L 33/54* (2013.01); *H01L 33/007* (2013.01); *H01L 2933/005* (2013.01); *H01L 2933/0041* (2013.01); *H01L 2933/0083* (2013.01)

(56) References Cited

U.S. PATENT DOCUMENTS

| | | | |
|---|---|---|---|
| 8,652,358 B2 | 2/2014 | Okuyama et al. | |
| 8,916,399 B2 | 12/2014 | Ichikawa | |
| 9,842,972 B2 | 12/2017 | Bergenek et al. | |
| 2008/0315228 A1* | 12/2008 | Krames | H01L 33/46 257/98 |
| 2010/0045163 A1 | 10/2010 | Winkler et al. | |
| 2011/0012155 A1* | 1/2011 | Huang | H01L 33/0095 257/98 |
| 2013/0234185 A1* | 9/2013 | Akselrod | H01L 33/502 257/98 |

FOREIGN PATENT DOCUMENTS

| | | | |
|---|---|---|---|
| CN | 102157655 A | 8/2011 | |
| CN | 102656713 A | 9/2012 | |
| JP | 11307813 A | 11/1999 | |
| JP | 2002335010 A | 11/2002 | |
| JP | 2002344021 A | 11/2002 | |
| JP | 2004-253743 A | 9/2004 | |
| JP | 20043363149 A | 12/2004 | |
| JP | 2005514301 A | 5/2005 | |
| JP | 2012-201714 A | 10/2012 | |
| RU | 2202843 C2 | 4/2003 | |
| WO | 0137351 A1 | 5/2001 | |
| WO | 2011126000 A1 | 10/2011 | |
| WO | 2010079779 A1 | 6/2012 | |

OTHER PUBLICATIONS

Subrata et al., "Anisotropy of Optical Absorption and Fluorescence in Al2O3 CMG Crystals," Journal of Applied Physics, vol. 98, No. 3, Aug. 8, 2005.
Akselrod, M. S. et al., "New aluminum oxide single crystals for volumetric optical data storage," Optical Data Storage 2003, Optical data storage, SPIE, 2003, 5069, 244-251.
Akselrod, M. S. et al., "Fluorescent aluminum oxide crystals for volumetric optical data storage and imaging applications," J. Fluoresc., 2003, 13, 503-511.
Akselrod, M. S. & Akselrod, A. E, "New Al2O3:C,Mg crystals for radiophotoluminescent dosimetry and optical imaging," Radiat. Prot. Dosimetry, 2006, 119, 218-221.
Ramirez, R. et al., "Electroluminescence in magnesium-doped Al2O3 crystals," Radiation Effects and Defects in Solids, 2001, 154, 295-299.
Ramirez, R. et al., "Photochromism of vacancy-related defects in thermochemically reduced alpha-Al2O3:Mg single crystals," Applied Physics Letters, AIP, 2005, 86, 081914.
Ramirez, R. et al., "Optical properties of vacancies in thermochemically reduced Mg-doped sapphire single crystals," Journal of Applied Physics, AIP, 2007, 101, 123520.
Sykora, G. et al., "Novel Al2O3:C,Mg fluorescent nuclear track detectors for passive neutron dosimetry," Radiation Protection Dosimetry, 2007, 126, 1-4.
Sykora, G. et al., "Spectroscopic properties of novel fluorescent nuclear track detectors for high and low LET charged particles," Radiation Measurements, 2008, 43, 422-426.
Sykora, G. et al., "Properties of novel fluorescent nuclear track detectors for use in passive neutron dosimetry," Radiation Measurements, 2008, 43, 1017-1023.
Sykora, G. J. & Akselrod, M. S., "Photoluminescence study of photochromically and radiochromically transformed Al2O3:C,Mg crystals used for fluorescent nuclear track detectors," Radiation Measurements, 2010, 45, 631-634.
Tardio, M. et al, "High temperature semiconducting characteristics of magnesium-doped alpha-Al2O3 single crystals," Applied Physics Letters, AIP, 2001, 79, 206-208.
Tardio, M. et al, "Electrical conductivity in magnesium-doped Al2O3 crystals at moderate temperatures," Radiation Effects and Defects in Solids, 2001, 155, 409-413.
Tardio, M. et al, "Photochromic effect in magnesium-doped alpha-Al2O3 single crystals," Applied Physics Letters, AIP, 2003, 83, 881-883.
Tardio, M. et al, "Enhancement of electrical conductivity in alpha-Al[sub 2]O[sub 3] crystals doped with magnesium," Journal of Applied Physics, AIP, 2001, 90, 3942-3951.
Tardio, M. et al, "Electrical conductivity in undoped alpha-Al2O3 crystals implanted with Mg ions," Nuclear Instruments and Methods in Physics Research Section B: Beam Interactions with Materials and Atoms, 2008, 266, 2932-2935.
Sanyal et al., "Anisotropy of Optical Absorption and Fluorescence in Al2O3:C,Mg Crystals", Journal of Applied Physics, vol. 98, No. 3, Aug. 8, 2005, p. 33518-1-33518-12.
First Office Action dated Dec. 28, 2016, China Patent Application No. 201480005094.X, 11 pages.
Second Office Action dated Sep. 14, 2017, China Patent Application No. 201480005094.X, 28 pages.
Office Action dated Nov. 28, 2017, Japan application No. 2015-552166, 5 pages.
Official Action dated Jan. 12, 2018, Russian Application No. 2015134352/28, 12 pages.

* cited by examiner

| Center | Absorption | Emission | Anisotropy |
|---|---|---|---|
| F | 205 | 420 | |
| F(Mg) | | | |
| F$^+$ | 230 / 255 | 330 | |
| F$^+$(Mg) | | | |
| F$_2$ | 358 | 380 | |
| F$_2^+$ | 302 | 515 | |
| F$_2^+$(2Mg) | 260 / 335 / 620 | 750 | 2.4 |
| F$_2^{2+}$ | | | (3.3) |
| F$_2^{2+}$(2Mg) | 435 | 520 | 3.4 |

LED USING LUMINESCENT SAPPHIRE AS DOWN-CONVERTER

CROSS-REFERENCE TO RELATED APPLICATIONS

This application is a division of U.S. application Ser. No. 14/761,115, filed on Jul. 15, 2015, which claims priority from a U.S. Provisional Application Ser. No. 61/753,175, filed on Jan. 16, 2013, by the present inventor and assigned to the present assignee, incorporated herein by reference.

FIELD OF THE INVENTION

This invention relates to the wavelength conversion of light emitting diodes (LEDs) and, in particular, to using luminescent sapphire as a wavelength conversion material integrated into an LED die.

BACKGROUND

Phosphor-converted LEDs (pcLEDs) are currently employed in a wide range of applications, such as for white light LEDs, amber LEDs, etc. Phosphor-converted LEDs comprise an active primary LED light source (typically a III-nitride p-n junction emitting blue light) and a passive secondary light source (phosphor) that absorbs part of the primary light and down-converts it to a secondary light of lower energy. The combination of the blue light leaking through the phosphor layer and the secondary light can produce a wide range of colors. Multiple phosphors may be used to contribute different wavelengths. The secondary light source is not necessarily a phosphor but may be, for example, a quantum dot layer, so we can more generally describe such LEDs as down-converted LEDs (dcLEDs).

The first white LEDs comprised a blue primary light source (an InGaN/GaN junction LED die) having a green emitting phosphor coating ($Y_3Al_5O_{12}$:Ce (YAG)). The Ce activator of the YAG phosphor absorbs a part of the blue primary light and emits a broad emission centered in the green. The resulting emission spectrum of the LED is therefore the combination of blue and green light, appearing white. State of the art LEDs now employ a combination of multiple phosphors with a wide range of emission possibilities. Typical warm white LEDs contain at least one green and one red emitting phosphor.

The phosphor layer may be formed in a number of ways, such as mixing phosphor powder in a transparent binder (e.g., silicone, glass, epoxy) and depositing the mixture on top of the blue LED die, or attaching a pre-formed phosphor tile to the LED die with a transparent adhesive (e.g., silicone), or depositing the phosphor over the LED die using electrophoresis. A pre-formed phosphor tile is typically made by sintering phosphor powder under pressure.

It is also known to embed phosphor into a solid transparent matrix (e.g., glass) to create a luminescent substrate, then deposit a seed layer over the substrate, and then epitaxially grow the LED layers over the seed layer.

Some drawbacks of the above-mentioned pcLEDs include the following.

The phosphor layer covering the blue LED die induces scattering of the primary light and thereby reduces the conversion efficiency.

The transparent binders for creating a phosphor mixture, and the adhesives used for attaching a phosphor tile to the LED die, have major disadvantages, such as having an index of refraction lower than the III-nitride and the phosphors, which reduces the conversion efficiency, and their thermal conductivity is low, which reduces LED efficacy and reliability.

Substrates infused with phosphor are inadequate substrates for epitaxial growth of the III-nitride junction due to lattice mismatches and different coefficients of thermal expansion (CTE). Growing on these substrates requires the deposition of a seed layer, which can reduce the junction quality and performance, and is expensive. The CTE mismatches still remain.

The above-mentioned secondary light sources' intensities and wavelengths cannot be tuned once integrated into the LEDs. This can lead to a large spread in color within the produced LEDs. LEDs not meeting the target color criteria result in a lower production yield and an increase of the overall LED cost.

SUMMARY

In accordance with the present invention, luminescent sapphire material is used either as the sole down-converter for the LED primary light or is used in conjunction with other down-conversion materials, such as phosphor or quantum dots. The luminescent sapphire may be in a powder form and deposited over the LED die or may form the growth substrate for the LED epitaxial layers.

Luminescent sapphire is purely transparent and does not scatter light passing through. The substitution, partial or total, of the phosphor by a luminescent sapphire can therefore improve the LED performance.

Sapphire is also a common growth substrate material employed for III-nitride blue LEDs. A highly efficient p-n junction can therefore be grown using a luminescent sapphire growth substrate without major changes in the epitaxial growth process. In one embodiment, because the high temperature of epitaxial growth destroys the desired luminescence properties of the sapphire, a subsequent annealing step at a lower temperature is used to reactivate the luminescence centers in the sapphire.

Having the p-n junction directly grown on a luminescent sapphire obviates the need for any binders or adhesives that are conventionally used to provide a phosphor layer over the top of an LED die. This can lead to a reduced cost, higher conversion efficiency, and higher reliability of the LEDs.

In one embodiment, the LED is a flip chip that generates primary blue light, and the luminescent sapphire growth substrate generates green secondary light. The blue light not converted to green light by the substrate passes through the transparent substrate.

The overall color of an LED containing luminescent sapphire can be tuned even after integration of the luminescent sapphire into the LED die. This can be done by modifying the sapphire's optical properties using a laser and/or heat so that the final LED meets the required color criteria.

BRIEF DESCRIPTION OF THE DRAWINGS

Elements that are the same or similar are labeled with the same numeral.

DETAILED DESCRIPTION

Description of Luminescent Sapphire

Sapphire refers herein to the aluminum oxide corundum in the form of a single crystal. The main chemical composition is $Al_2O_3$. The sapphire can contain other elements as dopants and impurities but is still considered to be sapphire. Single crystals of sapphire are typically grown using a variation of the Czochralski process.

As used herein, the term luminescent sapphire refers to a sapphire exhibiting luminescence corresponding to at least its $F_2$-like centers, described below.

F-like centers are color centers of the luminescent sapphire. The F-like centers are defined herein as the different chemical variations of a single vacancy of oxygen inside the lattice of the sapphire. Such oxygen vacancies are typically created by using a highly reductive atmosphere during the sapphire crystal growth or the subsequent annealing. The sapphires containing a high concentration of F-like centers are commonly referred as $Al_2O_3$:C or TCR sapphire (thermochemically reduced).

The most common variations of the F-like centers are the following:

F center is an oxygen vacancy that trapped two electrons.
$F^+$ center is an oxygen vacancy that trapped one electron.
F(Mg) center is an F center with the presence of one or several Mg cations surrounding it.
$F^+$(Mg) center is an r center with the presence of one or several Mg cations surrounding it.

The presence of Mg cations surrounding the F-like centers results in a shift of the absorption and emission.

Figures 1, 2:
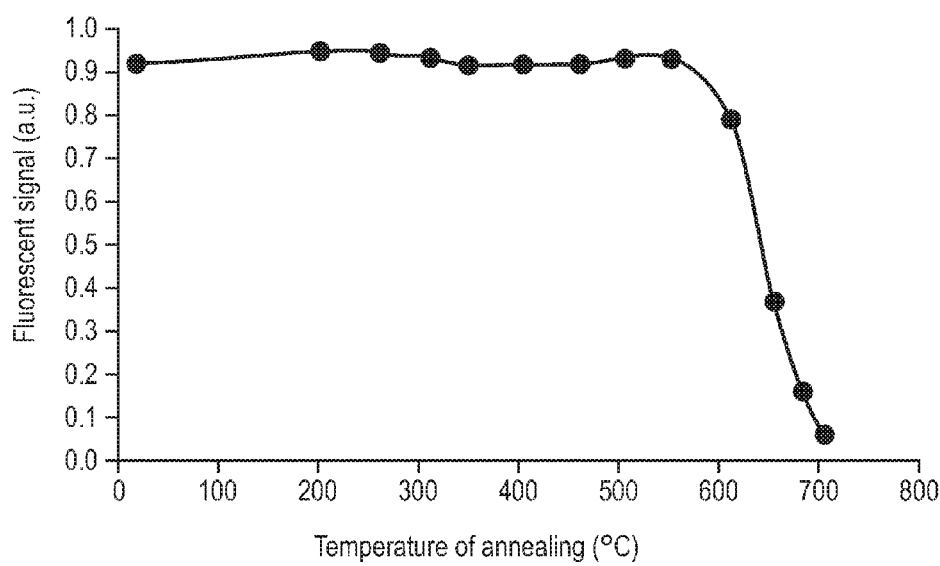
FIG. 1 is a table showing some of the various possible F-centers in luminescent sapphire along with their absorption wavelengths (in nm) and their emission wavelengths.
FIG. 2 is a graph showing how the fluorescence of a certain F-center in luminescent sapphire is reduced during annealing over 600° C.

The centers identified above are mainly identified by their optical absorption and luminescence emission bands as reported in the table of FIG. 1. FIG. 1 identifies the optical signatures of the known F-like and $F_2$-like centers in the luminescent sapphire.

We define the $F_2$-like centers as the different combinations of two aggregated F-like centers. The well reported variations of $F_2$-like centers are the following:

$F_2$ center is a cluster of two F centers.
$F_2^+$ center is a cluster of one $F^+$ center and one F center.
$F_2^+$(2Mg) center is a cluster of one $F_2^+$ center with the presence of two Mg cations surrounding it.
$F_2^{2+}$ center is a cluster of two $F^+$ centers.
$F_2^{2+}$(2Mg) center is a cluster of one $F_2^+$ center with the presence of two Mg cations surrounding it.

Some of the $F_2$-like centers luminesce (emit) in the visible spectrum (including green) so are the most relevant to the present invention.

The position of the oxygen vacancies respect to each other is identified by the anisotropy of the optical absorption bands, shown in FIG. 1. The presence of Mg cations surrounding the $F_2$-like centers results in a shift of the absorption and emission. Furthermore, different combinations of the various $F_2$-like centers may exist in the sapphire and will create slightly different optical features of the sapphire.

Thermal treatment of the sapphire is employed to create the luminescent sapphire. This thermal treatment is referred to as sapphire activation. This treatment creates an aggregation of the F-like centers to form the $F_2$-like centers to thus create the luminescent sapphire used in the present invention.

Optical treatment is employed to tune the emission of the luminescent sapphire. This is referred to as sapphire conditioning. This treatment modifies the concentrations of the different $F_2$-like centers.

Accordingly, the various embodiments of dcLEDs described below using luminescent sapphire can by tuned to emit a wide variety of colors by suitable sapphire activation and conditioning.

The creation and destruction of the $F_2$-like centers in sapphire are thermally activated. FIG. 2 is a graph of the temperature stability of a 750 nm emission of luminescent sapphire (secondary light) under 650 nm laser stimulation (primary light). FIG. 2 shows that the fluorescence (luminescence intensity) of the $F_2$-like centers that emit at 750 nm (see FIG. 1 where the $F_2^+$(2Mg) center has an emission of 750 nm) quickly goes down after annealing above about 600° C. Although the particular fluorescence wavelength and stimulation wavelength in FIG. 2 are generally not used in the LED embodiments, FIG. 2 shows how high temperatures generally affect the optical properties of the luminescent sapphire.

Figure 3:
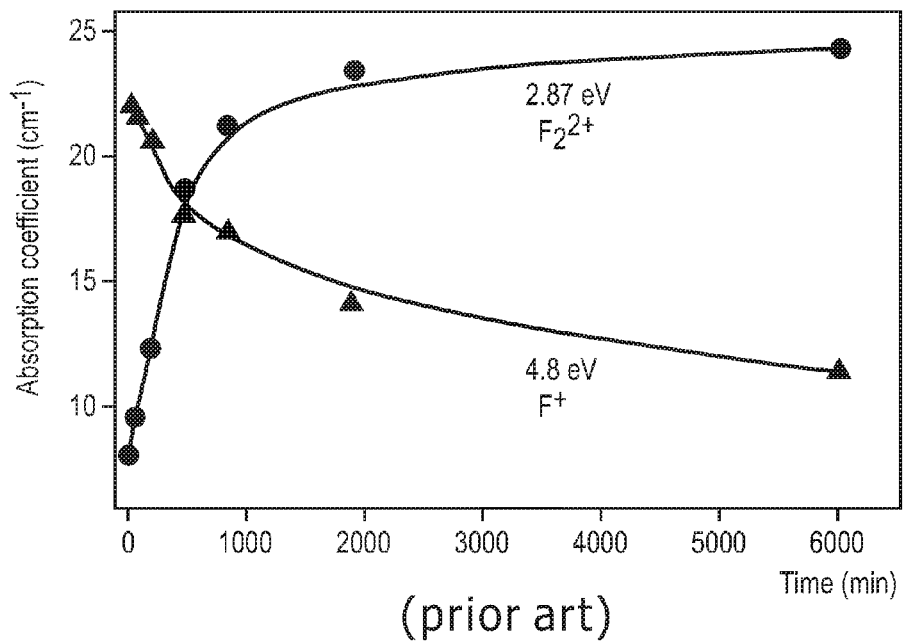
FIG. 3 is a graph showing how the absorption (and creation) of certain F-centers in luminescent sapphire is increased over time during annealing at 500° C.

FIG. 3 is a graph of the absorption coefficient of the 2.87 eV and 4.8 eV bands vs. isothermal annealing time at 773 K (500° C.). The 2.87 eV and 4.8 eV bands are both shorter wavelengths than typically used in LEDs. FIG. 3 shows the increase of the $F_2$-like centers' concentration during the annealing at 500° C., which correlates to the graphed increase of the $F_2^{2+}$ absorption coefficient. FIG. 3 also shows the simultaneous decrease of the $F^+$ absorption coefficient with anneal time.

As shown by FIGS. 2 and 3, the destruction of the $F_2$-like centers starts at approximately 600° C. whereas their population can be increased by prolonged annealing of the sapphire at 500° C. During the annealing at 500° C., the $F^+$ centers aggregate to form $F_2^{2+}$ centers. As the annealing time increases, the absorption coefficient of the $F_2^{2+}$ center increases whereas the absorption coefficient of the $F^+$ center decreases. The absorption coefficient correlates to the population of the associated centers. Such an aggregation step (using heat) is referred to herein as sapphire activation.

FIGS. 2 and 3 were obtained from the papers: Ramirez, R. et al., Photochromism of vacancy-related defects in thermochemically reduced alpha-$Al_2O_3$:Mg single crystals, Applied Physics Letters, AIP, 2005, 86, 081914; and Ramirez, R. et al., Optical properties of vacancies in thermochemically reduced Mg-doped sapphire single crystals, Journal of Applied Physics, AIP, 2007, 101, 123520, both incorporated herein by reference.

The role of the Mg is reported to help aggregation of the $F_2$-like centers. Such sapphire is also referred to $Al_2O_3$:C, Mg. Sapphire may be grown, using known methods, to have the $Al_2O_3$:C,Mg composition.

One of the reported properties of the $F_2$-like centers in sapphire is photochromic conversion under sufficient photon irradiance fluxes. It is reported that the excitation of the luminescent sapphire by a high peak power laser at a wavelength of 440 nm can decrease the concentration of the blue-absorbing/green-emitting $F_2^{2+}$(2Mg) centers and increase the $F_2^{+}$(2Mg) center (equation 1 below). This is an optical treatment of the sapphire that further tunes its fluorescent properties. The concentrations of other centers simultaneously change such that the charge balance remains respected. It is also reported that the concentration of the $F_2^{2+}$(2Mg) centers can be increased by exciting the luminescent sapphire with a high peak power laser at a wavelength of 330 nm (equation 2).

Such tuning of the $F_2$-like centers concentrations by optical treatment is herein defined as sapphire conditioning.

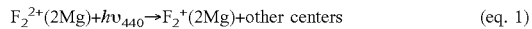

$$F_2^{2+}(2Mg)+h\nu_{440} \rightarrow F_2^{+}(2Mg)+\text{other centers} \quad (eq.\ 1)$$

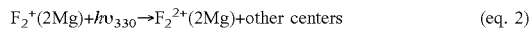

$$F_2^{+}(2Mg)+h\nu_{330} \rightarrow F_2^{2+}(2Mg)+\text{other centers} \quad (eq.\ 2)$$

The sapphire's photochromism properties are not restricted to 440 nm and 330 nm excitation. Other wavelengths, preferentially at the absorption bands of the $F_2$-like centers, can be employed. The underlying "2-photon absorption process" controlling the photochromism properties is well described in literature and need not be described herein.

In one embodiment, the sapphire is subject to activation (thermal) and conditioning (optical) to absorb some of the blue primary light generated by the LED's pn junction and emit green secondary light. The precise activation and conditioning depends on the peak wavelength of the primary light, the thickness/density of the sapphire, the target color point, and other factors. The required activation and conditioning to achieve the target color may be determined empirically for a particular application. A red phosphor may then be added on top of the LED to create white light.

Figure 4:
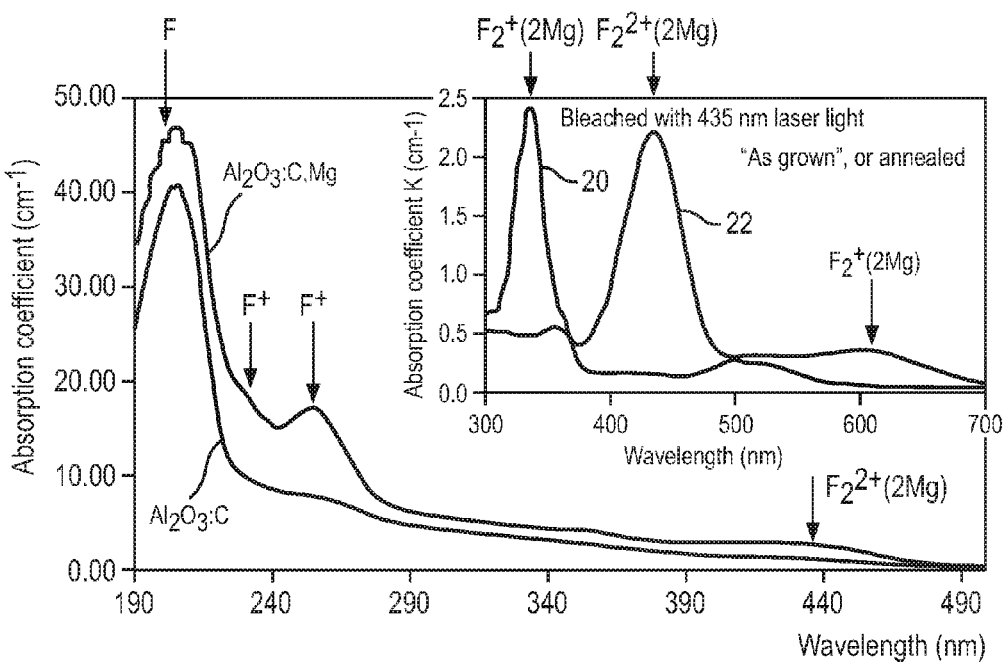
FIG. 4 is a graph showing the absorption of various F-centers in luminescent sapphire over a range of wavelengths, with the graph magnified for wavelengths between 300-700 nm.

FIG. 4 is a graph of absorption vs. wavelength for F, $F^+$, and $F_2^+$(2Mg) centers for $Al_2O_3$:C,Mg and $Al_2O_3$:C. The inset is a magnified view for wavelengths 300-700 nm. Curve 20 is for sapphire "bleached" with 435 nm laser light (sapphire conditioning), and curve 22 is for sapphire "as grown" or annealed. FIG. 4 was taken from the following papers: Akselrod, M. S. et al., New aluminum oxide single crystals for volumetric optical data storage, Optical Data Storage 2003, Optical data storage, SPIE, 2003, 5069, 244-251; and Akselrod, M. S. et al., Fluorescent aluminum oxide crystals for volumetric optical data storage and imaging applications, J. Fluoresc., 2003, 13, 503-511, both incorporated herein by reference.

Of particular interest is the wavelength range of about 450-650 nm, which generally includes the blue to red range.

Although the properties, creation, and adjustment of luminescent sapphire are well known, the inventor is unaware of any integration of luminescent sapphire in an LED die for down-conversion.

Conversion efficiency (CE) is the luminous flux (lm) emitted by the LED (including the down-converted light) per amount of primary source light. The CE is a good ruler of the efficiency of the secondary source (the luminescent material) and its integration in the LEDs. In the following embodiments, using the luminescent sapphire as a down-converter, the CE of the resulting LED is improved vs. the CE of a pcLED.

Embodiment 1

In a first embodiment, the luminescent sapphire is used in powder form instead of, or in addition to, using a phosphor powder. An example of this first embodiment is represented by FIGS. 5 and 6.

As a preliminary matter, bulk luminescent sapphire ($Al_2O_3$:C,Mg or $Al_2O_3$:C, depending on the wavelengths of interest) is grown using conventional techniques, and the sapphire is activated and conditioned, as described above and in accordance with known techniques, to have the desired light absorption and emission properties for the particular application (e.g., LED die and target color). Empirical testing may be performed to achieve the target absorption and emission properties. The target absorption wavelength will be the peak wavelength emission of the actual LED pn junction (the active layer) used and will typically be in the visible blue range of wavelengths. In one embodiment, the emission of the luminescent sapphire is green when energized with the blue LED light. Accordingly, adding a red phosphor layer will create warm white light.

Figure 5:
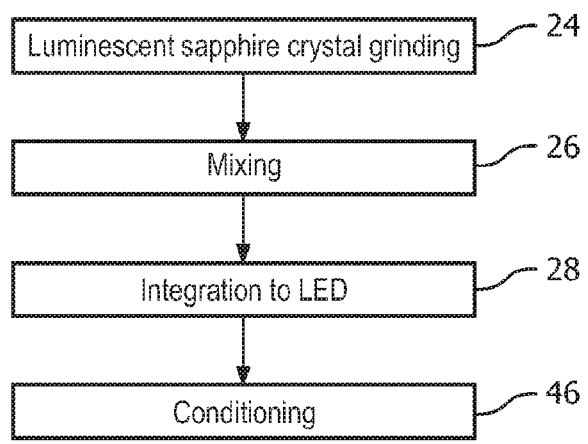
FIG. 5 is a flowchart of various steps used to form a dcLED with a luminescent sapphire in accordance with a first embodiment of the invention.
Figure 6:
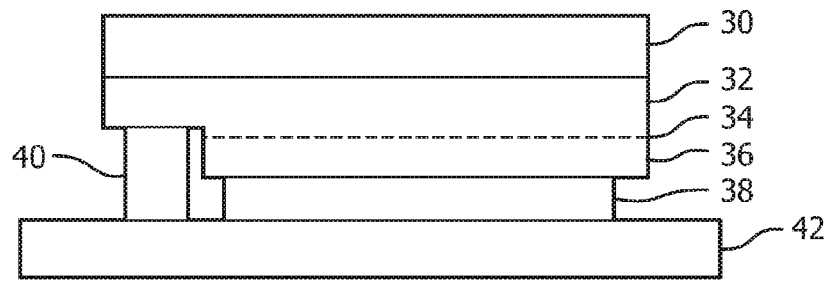
FIG. 6 is a cross-sectional view of a flip chip LED die with a coating of a luminescent sapphire mixture over the top of the LED die, in accordance with the first embodiment of the invention.

In step 24 of FIG. 5, the luminescent sapphire crystal is subject to a grinding process and sieved to the desired range of particle size. An acceptable range of particle size distribution D50 is 10 to 50 μm. Particle size distribution D50 is also known as the median diameter of the particle size distribution and is the value of the particle diameter at 50% in the cumulative distribution.

In step 26, the luminescent sapphire powder is infused into a transparent matrix (such as silicone), with appropriate and conventional additives, and homogeneously mixed. The chosen additives depend on the application and may include phosphor powders, dispersants, etc.

In step 28, the mixture is integrated into the LED so as it can absorb the primary light and down-convert it to the desired secondary light. For example, the mixture can be integrated by lamination (e.g., forming a pre-formed sheet or tile and affixing it over the LED wafer or die), overmolding (e.g., placing LED dies mounted on a wafer in individual mold indentions filled with the mixture and then curing the mixture), or spray-coating the mixture over at least the top surface of the LED die. The result is a dcLED characterized by a certain color point. The dcLED may or may not include phosphor in the mixture or as a separate layer.

FIG. 6 is a cross-sectional view of one type of LED (a flip chip) with the luminescent sapphire mixture deposited over the LED's semiconductor surface as a luminescent sapphire layer 30 and cured. Other type of LEDs may be used, such as vertical LEDs, lateral LEDs, etc. In the example, an N-type layer 32 is epitaxially grown over a sapphire growth substrate (which has been removed by laser lift-off), an active layer 34 is epitaxially grown over the N-type layer 32, and a P-type layer 36 is epitaxially grown over the active layer 34. The layers 34 and 36 are etched to expose the N-type layer 32, and metal contacts 38 and 40 are deposited to electrically contact the P-type layer 36 and N-type layer 32, respectively. The LED die is then mounted on a submount 42 or other substrate. The submount 42 has metal pads that are directly bonded to the metal contacts 38 and 40, and the pads are ultimately electrically connected to a power source.

The exposed surface of the N-type layer 32 may be roughened to improve light extraction prior to the luminescent sapphire layer 30 being deposited.

In prior art LEDs using only a phosphor for down-conversion, if the target color point is not achieved, the LED is either rejected or downgraded to a lower quality LED. This increases the overall cost of LED production.

However, by using a luminescent sapphire layer 30 overlying the N-type layer 32, the color point of the dcLED may be adjusted after the dcLED is energized and tested while bonded to the submount 42 or while in wafer form and probed. The testing may also be performed using an external energizing light source. The color point adjustment may be by sapphire conditioning (step 46), where the photochromic properties of the luminescent sapphire layer 30 are adjusted using a high peak power laser to create a color shift. Additional detail is provided below. This post-integration adjustment increases the production yield of dcLEDs (and therefore decreases the cost of production) and improves the color point control.

Finally, other additional optics, such as a transparent dome lens (not shown), can be placed or molded over the dcLED in order to improve the light extraction of the dcLED.

If the above process has been performed on a wafer scale, the LED dies/submounts are then singulated.

There may be one or more other layers between the LED semiconductor layers and the luminescent sapphire layer 30.

Practical Example of Embodiment 1

A luminescent sapphire rich in blue-absorbing/green-emitting $F_2^{2+}$(2Mg) centers is ground and sieved to a particle size in the range 20 to 40 μm. The powder is mixed with silicone and a red phosphor in such proportion to cause the resulting dcLED color point to be a warm white 3000K color temperature. The silicone employed is transparent and preferentially has an index of refraction greater than 1.50. The red phosphor used is, for example, a member of the phosphor family $(Ca,Sr)AlSiN_3$:Eu or the phosphor family $(Ba,Sr)Si_5N_8$:Eu. The slurry silicone+luminescent sapphire powder+red phosphor is homogeneously mixed to form the down-converter mixture (layer 30 in FIG. 6). In order to create the desired warm white pcLED, the mixture is integrated with a primary blue source: for example, blue-emitting GaN-based LED dies emitting a peak wavelength between 440 to 460 nm. These dies may be based on thin-film flip chip technology and have an InGaN/GaN p-n junction. Other types of LEDs may be used.

A well-controlled volume of the mixture is dispensed above the die using any conventional deposition process, normally used for dispensing a phosphor mixture. The mixture is then cured by heat or UV. At this stage, the color point of some LEDs can be outside of the targeted zone for a 3000K LED.

Figure 7:
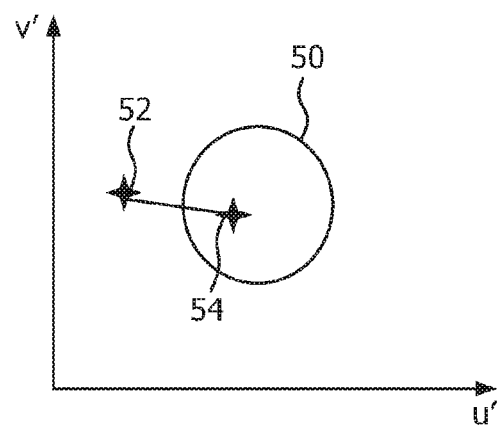
FIG. 7 illustrates how the optical properties of the luminescent sapphire in FIG. 6 may be changed after integration with the LED to color shift the LED's emission into a target color zone.

In the example, of FIG. 7, the circle 50 represents an acceptable range of color points (the target zone) that the final dcLED should exhibit. The u' and v' axes represent the coordinates in the CIE 1976 color system. Point 52 represents the color point of the LED(s) measured after testing after step 28 in FIG. 5. A high power pulsed laser is then used to shift the color point to the point 54 within the circle 50 during the conditioning step 46 in FIG. 5. The proper conditioning may be determined empirically. The testing and conditioning may be performed automatically using a look-up table cross-referencing the measured color point to the required conditioning for shifting the color emission to within the target zone circle 50. The required laser power and/or duration are then determined (also by the look-up table), and the conditioning is performed. The conditioning may be performed incrementally, with testing after each incremental step to ensure there is no over-compensation.

If there is too much secondary light generated by the luminescent sapphire, the required adjustment could be obtained by decreasing the down-conversion power of the luminescent sapphire. This can be performed by reducing the concentration of $F_2^{2+}$(2Mg) centers in the luminescent sapphire during a conditioning step. For this, the luminescent sapphire can be exposed to a high peak power laser at a wavelength of 440 nm for a period of time, determined empirically. See equations 1 and 2 above.

Other adjustments can be used to create a precise color emission such that the LEDS need not be "binned."

Embodiment 2

Figure 8:
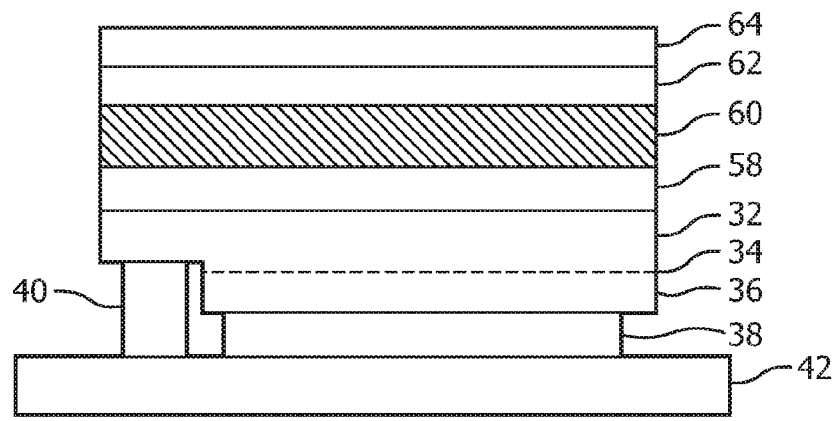
FIG. 8 is a cross-sectional view of a flip chip LED die with a pre-formed luminescent sapphire tile affixed over the top of the LED die, in accordance with a second embodiment of the invention.
Figure 9:
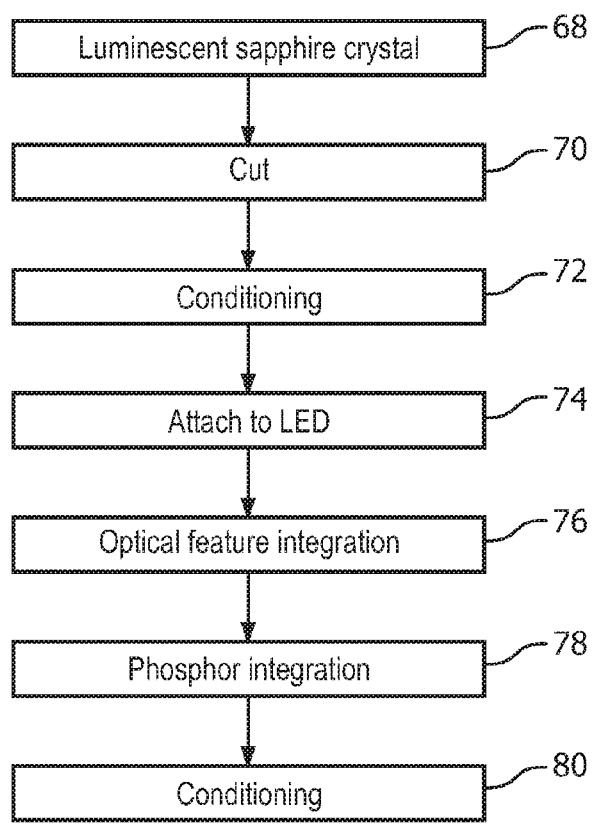
FIG. 9 is a flowchart of various steps used to form a dcLED with a luminescent sapphire in accordance with the second embodiment of the invention.

In a second embodiment, shown in FIGS. 8 and 9, the luminescent sapphire is integrated as a pre-formed single crystal tile that is attached to the top surface of the primary light source.

In FIG. 8, the primary light source LED is similar to that of FIG. 6 where an N-type layer 32 is epitaxially grown over a sapphire growth substrate, an active layer 34 is epitaxially grown over the N-type layer 32, and a P-type layer 36 is epitaxially grown over the active layer 34. The layers 34 and 36 are etched to expose the N-type layer 32, and metal contacts 38 and 40 are deposited to electrically contact the P-type layer 36 and N-type layer 32, respectively. The sapphire grows substrate is removed by laser lift-off and the exposed surface of the N-type layer 32 may then be roughened. The LED die is then mounted on a submount 42 or other substrate. The submount 42 has metal pads that are directly bonded to the metal contacts 38 and 40, and the pads are ultimately electrically connected to a power source.

An adhesive layer 58, such as silicone, is deposited over exposed N-type layer 32. A luminescent sapphire tile 60 is then positioned and pressed on the adhesive layer 58. An optional optical features layer 62 may then be positioned or molded over the tile 60, such as a filter layer or a textured layer for improving light extraction. An optional phosphor layer 64 (e.g., red phosphor in a silicone binder) may then be deposited for further color point adjustment. The laser exposure step for conditioning the tile 60 may be performed prior to the layers 62 and 64 being deposited. The laser exposure step may be performed on the tile 60 before or after the tile 60 is affixed to the LED. All steps may be performed on a wafer scale on a submount wafer populated with an array of LED dies.

In another embodiment, the luminescent sapphire tile 60 comprises luminescent sapphire particles in a cured binder.

FIG. 9 identifies various steps for fabricating the device of FIG. 8.

A flat luminescent sapphire crystal wafer is first formed (step 68) and then cut into tiles (step 70) with a size generally corresponding to the primary source LED (e.g., 1 mm²). The tile 60 (typically before singulation) is then conditioned (step 72) using a laser such that it presents the targeted concentration of the desired $F_2$-like color centers (see equations 1 and 2 above).

The tile 60 is then attached to the LED die using an adhesive layer (step 74).

At this stage, different options can be executed:
  a. No other phosphors are added to the device, whereby all the down-converted emission is performed by the luminescent sapphire tile 60. A conditioning step can be further employed to correct the color point if necessary. In one example, the green emission is increased by increasing the population of $F_2^{2+}(2Mg)$) centers.
  b. An optical features layer 62, such as a dichroic filter, may be deposited (step 76) over the tile 60 in order to control the emission (angular and spectral).
  c. One or more phosphors may be dispensed over the tile 60 (step 78) to form the phosphor layer 64 in FIG. 8. The optical features layer 62, such as a dichroic filter can be optionally deposited in between the phosphor layer 64 and the tile 60. The conditioning step 80 can optionally be used to correct the LED color point while taking the phosphor contribution into account. For example, a warm white LED with a color temperature of 3000K could be fabricated by integrating a red-emitting phosphor layer 64 over the tile 60.
  d. Same as version c but with the integration of the phosphor layer over the LED die first and then adhesion of the luminescent sapphire tile 60 over the phosphor layer. The optical features layer and/or the conditioning step can further be applied before encapsulation of the device.

Embodiment 3

Figure 10:
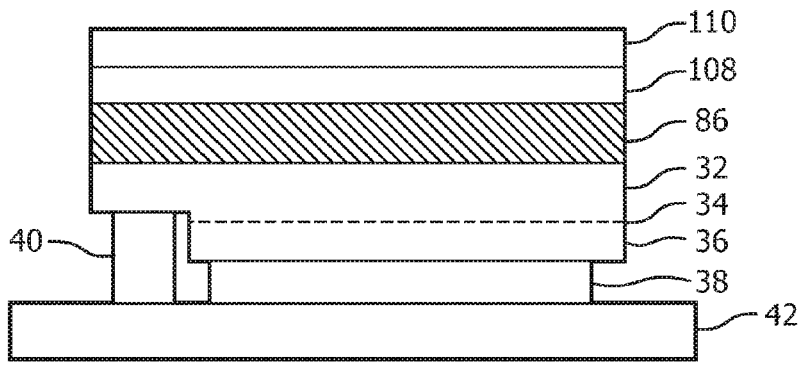
FIG. 10 is a cross-sectional view of a flip chip LED die with its epitaxial layers grown over a luminescent sapphire growth substrate, in accordance with a third embodiment of the invention.
Figure 11:
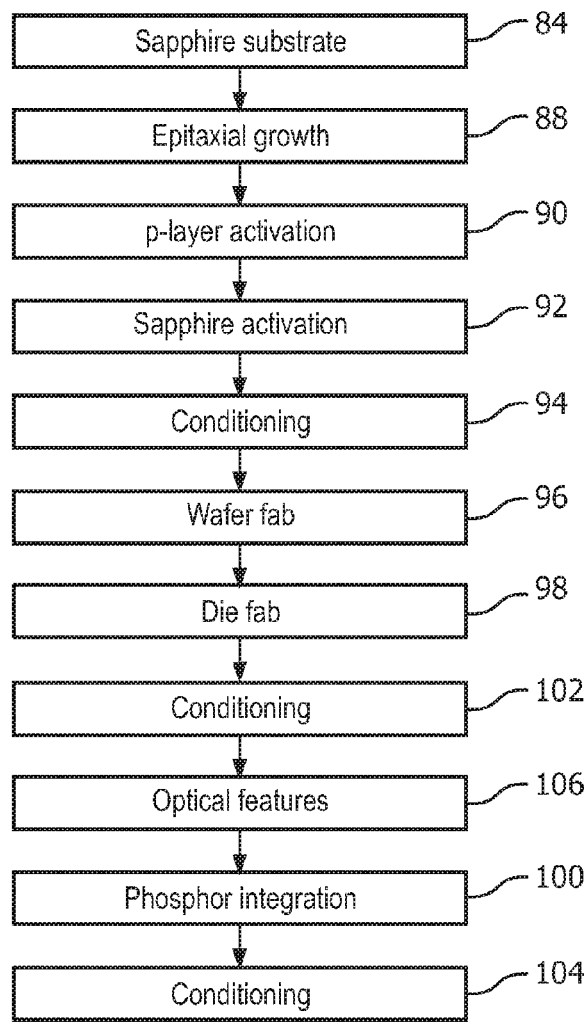
FIG. 11 is a flowchart of various steps used to form a dcLED with a luminescent sapphire in accordance with the third embodiment of the invention.

In a third embodiment, the luminescent sapphire is used as a growth substrate on which the LED semiconductor layers are epitaxially grown as illustrated in FIGS. 10 and 11.

First, as shown in FIG. 11, a sapphire single crystal is chosen such that it contains the desired F-like centers (step 84). The sapphire single crystal is prepared as a growth substrate 86 (FIG. 10) by being cut and polished to allow epitaxial growth on it.

In step 88, the III-nitride p-n junction (layers 32, 34, 36) is grown on one side of the sapphire substrate 86. During this step, the temperature inside the growth reactor is maintained between 700 and 1100° C. for several hours under a reducing atmosphere. At such temperature and time, the luminescent $F_2$-like centers of the sapphire are destroyed (see FIG. 2). Therefore, it is pointless to use a luminescent sapphire as a growth substrate unless the centers can be reactivated.

After the epitaxial growth, the wafers are removed from the reactors. An annealing for several minutes in the range 500 to 600° C. is then performed in order to activate the P-dopants in the P-type layer 36 of the III-nitride junction (step 90). This annealing is performed in an oxygen-containing atmosphere.

Further at this stage of the process, the sapphire substrate 86 containing F-like centers is activated (step 92) to create a luminescent sapphire. Physically, the sapphire activation creates an aggregation of F-like centers to form $F_2$-like centers. The sapphire substrate 86 can be activated by an annealing or several annealings at a temperature within the range 300-700° C. (below the epitaxial growth temperature). For example, the sapphire substrate 86 can be activated by annealing the wafer at a temperature of 500° C. for several hours as published in the literature. The concentration of $F_2$-like centers can be controlled by adjusting the annealing time and temperature. Furthermore, the sapphire substrate 86 activation leads to the creation of many types of $F_2$-like centers. If only one particular species of $F_2$-like center is of interest for down-conversion, then the desired $F_2$-like center concentration can be obtained by applying a conditioning (laser) step 94 to the sapphire substrate 86. For example, the concentration of the blue-absorbing/green-emitting $F_2^{2+}$ (2Mg) centers can be increased by exciting the sapphire substrate 86 with a high peak power laser at a wavelength of 330 nm. The quality of such conditioning can be controlled by, for example, measuring the fluorescence intensity generated by the $F_2^{2+}$(2Mg) centers of the luminescent sapphire under excitation at 450 nm (e.g., by an external source or by energizing the LED).

Once the targeted concentration of desired $F_2$-like centers is obtained, the wafer can return to the normal fabrication process for the LEDs, progressing from conventional wafer fab steps (grouped into step 96) to die fab steps (grouped into step 98) to phosphor integration (step 100). During these subsequent steps, the temperature is held below 600° C. and the activation of the sapphire substrate 86 is therefore preserved.

Optionally, more conditioning steps 102 and 104 can be added during the process in order to take advantage of photochromic properties of the luminescent sapphire. A conditioning step 102 could be performed after the singulated die is attached to a submount wafer in order to adjust the concentration of desired $F_2$-like centers for the actual primary light source efficiency and wavelength and reduce the v' dispersion of the produced LED population. Another conditioning step 104 could be undertaken after the phosphor integration step 100 in order to tune the color point as described in Embodiment 1.

Optical features (step 106) may also be added to the LED die.

FIG. 10 shows an optical features layer 108 and a phosphor layer 110, such as a dichroic filter layer and a red phosphor layer for creating white light. The filter layer may reflect the red light from the phosphor layer 110 but allow the shorter wavelength light to pass to avoid absorption of the red light by the LED.

In addition to the various benefits described above, by performing all down-conversion by the luminescent sapphire and not using phosphor, the LED may be used in harsh environments for many years such as in automobile headlamps. Phosphor is very sensitive to moisture and may ultimately degrade in a headlamp environment.

The following references identify the state of the art in luminescent sapphire and exemplify what one skilled in the art is aware of. Such references illustrate that one skilled in the art, after reading the present disclosure, is able to manufacture the luminescent sapphire and perform the required activation and conditioning to achieve the target color point of a dcLED. Such references are incorporated herein by reference.

1. Akselrod, M. S. et al., New aluminum oxide single crystals for volumetric optical data storage, *Optical Data Storage* 2003, *Optical data storage, SPIE,* 2003, 5069, 244-251
2. Akselrod, M. S. et al., Fluorescent aluminum oxide crystals for volumetric optical data storage and imaging applications, *J. Fluoresc.,* 2003, 13, 503-511
3. Akselrod, M. S. & Akselrod, A. E, New $Al_2O_3$:C,Mg crystals for radiophotoluminescent dosimetry and optical imaging, *Radiat. Prot. Dosimetry,* 2006, 119, 218-221

4. Ramirez, R. et al., Electroluminescence in magnesium-doped $Al_2O_3$ crystals, *Radiation Effects and Defects in Solids*, 2001, 154, 295-299
5. Ramirez, R. et al., Photochromism of vacancy-related defects in thermochemically reduced alpha-$Al_2O_3$:Mg single crystals, *Applied Physics Letters, AIP*, 2005, 86, 081914
6. Ramirez, R. et al., Optical properties of vacancies in thermochemically reduced Mg-doped sapphire single crystals, *Journal of Applied Physics, AIP*, 2007, 101, 123520
7. Sykora, G. et al., Novel $Al_2O_3$:C,Mg fluorescent nuclear track detectors for passive neutron dosimetry, *Radiation Protection Dosimetry*, 2007, 126, 1-4
8. Sykora, G. et al., Spectroscopic properties of novel fluorescent nuclear track detectors for high and low LET charged particles, *Radiation Measurements*, 2008, 43, 422-426
9. Sykora, G. et al., Properties of novel fluorescent nuclear track detectors for use in passive neutron dosimetry, *Radiation Measurements*, 2008, 43, 1017-1023
10. Sykora, G. J. & Akselrod, M. S., Photoluminescence study of photochromically and radiochromically transformed $Al_2O_3$:C,Mg crystals used for fluorescent nuclear track detectors, *Radiation Measurements*, 2010, 45, 631-634
11. Tardio, M. et al, High temperature semiconducting characteristics of magnesium-doped alpha-$Al_2O_3$ single crystals, *Applied Physics Letters, AIP*, 2001, 79, 206-208
12. Tardio, M. et al, Electrical conductivity in magnesium-doped Al2O3 crystals at moderate temperatures, *Radiation Effects and Defects in Solids*, 2001, 155, 409-413
13. Tardio, M. et al, Photochromic effect in magnesium-doped alpha-$Al_2O_3$ single crystals, *Applied Physics Letters, AIP*, 2003, 83, 881-883
14. Tardio, M. et al, Enhancement of electrical conductivity in alpha-Al[sub 2]O[sub 3] crystals doped with magnesium, *Journal of Applied Physics, AIP*, 2001, 90, 3942-3951
15. Tardio, M. et al, Electrical conductivity in undoped alpha-Al2O3 crystals implanted with Mg ions, *Nuclear Instruments and Methods in Physics Research Section B: Beam Interactions with Materials and Atoms*, 2008, 266, 2932-2935

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   light emitting diode (LED) semiconductor layers comprising an N-type layer, an active layer configured to emit a primary light, and a P-type layer; and
   luminescent sapphire distinct from a growth substrate for the semiconductor layers, the luminescent sapphire being affixed over a light emitting surface of the LED semiconductor layers,
   the LED semiconductor layers and the luminescent sapphire forming part of an LED die, the luminescent sapphire containing oxygen vacancies resulting in F-like centers having defined optical absorption and luminescence emission bands,
   the luminescent sapphire configured to absorb a portion of the primary light and down-converts the primary light to emit secondary light, via the F-like centers, such that an emission from the LED die includes at least a combination of the primary light and the secondary light.

2. A light emitting device, comprising:
   light emitting diode (LED) semiconductor layers comprising an N-type layer, an active layer configured to emit a primary light, and a P-type layer; and
   luminescent sapphire distinct from a growth substrate for the semiconductor layers, the luminescent sapphire being affixed over a light emitting surface of the LED semiconductor layers,
   the luminescent sapphire containing oxygen vacancies resulting in F-like centers having defined optical absorption and luminescence emission bands,
   the luminescent sapphire comprising luminescent sapphire particles combined with a binder to form a mixture, the mixture being located overlying the light emitting surface of the LED semiconductor layers.

3. The device of claim 2 wherein the luminescent sapphire is a pre-formed tile laminated over the semiconductor layers.

4. The device of claim 2 wherein the luminescent sapphire is a molded element over the semiconductor layers.

5. The device of claim 2 wherein the mixture is located directly on one of the LED semiconductor layers.

6. The device of claim 1 wherein the luminescent sapphire comprises a pre-formed tile that is affixed over the light emitting surface of the LED semiconductor layers.

7. The device of claim 6 wherein the tile comprises a single crystal of the luminescent sapphire.

8. The device of claim 6 wherein the tile comprises luminescent sapphire particles in a binder.

9. The device of claim 6 wherein the tile is directly affixed to one of the LED semiconductor layers with an adhesive layer.

10. The device of claim 1 wherein the N-type layer, the active layer, and the P-type layer are epitaxially grown over a sapphire growth substrate, which is distinct from the luminescent sapphire.

11. The device of claim 1 further comprising a phosphor layer overlying the LED semiconductor layers as part of the LED die, such that a light emission of the LED die comprises the primary light, the secondary light from the luminescent sapphire, and light from the phosphor layer.

12. The device of claim 11 wherein the luminescent sapphire comprises luminescent sapphire particles combined with a binder to form a mixture, wherein the mixture is located overlying the light emitting surface of the LED semiconductor layers, and wherein the phosphor is part of the mixture.

13. The device of claim 12 wherein the primary light is blue light, and the secondary light and light from the phosphor include green and red light.

14. The device of claim 11 wherein the primary light, the secondary light from the luminescent sapphire, and the light from the phosphor layer create white light.

* * * * *